US006177704B1

(12) United States Patent
Suzuki et al.

(10) Patent No.: US 6,177,704 B1
(45) Date of Patent: *Jan. 23, 2001

(54) SEMICONDUCTOR DEVICE CONTAINING A LATERAL MOS TRANSISTOR

(75) Inventors: Takashi Suzuki; Sachiko Kawaji; Tsutomu Uesugi, all of Aichi (JP)

(73) Assignee: Kabushiki Kaisha Toyota Chuo Kenkyusho, Aichi-gun (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/160,594

(22) Filed: Sep. 25, 1998

(30) Foreign Application Priority Data

Sep. 26, 1997 (JP) .................................................. 9-279467

(51) Int. Cl.[7] .......................... H01L 29/76; H01L 29/94; H01L 31/062; H01L 31/113; H01L 27/01
(52) U.S. Cl. .......................... 257/343; 257/329; 257/330; 257/331; 257/339; 257/347
(58) Field of Search ..................................... 257/343, 329, 257/330, 331, 339, 341, 342, 347

(56) References Cited

U.S. PATENT DOCUMENTS 4,890,142 * 12/1989 Tonnel et al. ........................ 257/343
5,181,088 * 1/1993 Mikata et al. ........................ 257/331
5,434,435 7/1995 Baliga .................................. 257/343
5,796,125 * 8/1998 Matsudai et al. .................... 257/343

FOREIGN PATENT DOCUMENTS 2-249276 * 10/1990 (JP) ..................................... 257/343
8-97411 4/1996 (JP) ..................................... 257/343

* cited by examiner

Primary Examiner—Steven H. Loke
(74) Attorney, Agent, or Firm—Oblon, Spivak, McClelland, Maier & Neustadt, P.C.

(57) ABSTRACT

A semiconductor device containing a lateral MOS transistor comprising a silicon substrate, an n-type first semiconductor layer constituting a drain drift region, a p-type second semiconductor layer prepared within the first semiconductor layer to constitute a body region and with a channel region formed within a portion of said body region, an n-type third semiconductor layer prepared on the surface of the second semiconductor layer to constitute a source region, an n-type fourth semiconductor layer constituting a drain region, and an insulation layer that is constituted of insulating material filled into a trench prepared in the first semiconductor layer and arranged along the two sides of the drain region. The drain region is formed into a region deeper than the insulation layer and in contact with the drain drift region at a portion beneath the insulation layer. The semiconductor device provides a high breakdown voltage and a low on-resistance, and can be fabricated with a reduced cell pitch.

10 Claims, 11 Drawing Sheets

SEMICONDUCTOR DEVICE CONTAINING A LATERAL MOS TRANSISTOR

BACKGROUND OF THE INVENTION

1. Field of the Invention

The present invention relates to a semiconductor device containing a lateral MOS transistor. More specifically, the present invention relates to technology suitable for use in a high breakdown voltage, low on-resistance, lateral power MOSFET that can be microminiaturized.

2. Description of the Related Art

A high breakdown voltage lateral trench MOSFET disclosed in the Japanese Patent Application Laid-Open No. 8-97411 has, as shown in FIG. 12, a p-type well region 2 formed on a p-type substrate 1, a diffusion layer comprising a source region 9 and a body region 8 formed within the above well region 2 using a double diffusion process with a self alignment technique, and a gate oxide layer 6 and a gate electrode 7 located on top of the structure. Further, a trench 3 is formed by a trench work within a drain drift region 4 to secure the drift length for accomplishing a high breakdown voltage. In the above-described structure, when a gate voltage is applied, electric current flows from a drain region 11 through the drain drift region 4 along the perimeter (A-B-C-D) of the trench 3 to reach a channel region 10. Note that the symbol 5 in FIG. 12 represents an insulation layer formed within the trench 3.

The high breakdown voltage lateral trench MOSFET of the Japanese Patent Application Laid-Open No. 8-97411 has the advantage of achieving a high breakdown voltage by allowing the drift current to flow through the trench region 3 thereby securing a sufficient drift length. However, since the breakdown voltage is determined by the length of the drain drift region 4, it is necessary to make the drift length longer to obtain a higher breakdown voltage. This has presented a disadvantage of a steep rise in on-resistance of a transistor through the increased resistive component of a drain drift region 4. Moreover, when the drain drift region 4 is created by ion implantation and thermal diffusion processes through the trench region 3, this creates an overlapped region between the n-drain drift region 4 and the p-channel region 10. This leads to an increase in the residual crystal defects or crowding of the current flow paths within the diffusion layer which forms a channel, thereby making the device liable to cause a reduction in electron mobility.

SUMMARY OF THE INVENTION

An object of the present invention is to provide a semiconductor device containing a lateral MOS transistor with a high breakdown voltage and a low on-resistance, which can be fabricated with a decreased dimension for the drain drift region and, therefore, can be microminiaturized.

The semiconductor device containing a lateral MOS transistor according to the present invention is characterized in comprising:

a semiconductor substrate;

a first semiconductor layer of a first conductive type formed on the semiconductor substrate to constitute a drain drift region;

a second semiconductor layer of a second conductive type formed in the first semiconductor layer to constitute a body region, the body region including a portion in which a channel region is formed;

a third semiconductor layer of the first conductive type formed in the second semiconductor layer to constitute a source region;

a fourth semiconductor layer of the first conductive type formed in the first semiconductor layer to constitute a drain region; and an insulation layer disposed in a trench which is formed in the first semiconductor layer by filling the trench with insulating material along two sides of the fourth semiconductor layer;

wherein the fourth semiconductor layer extends greater than the insulation layer in depth to contact the first semiconductor layer below the insulation layer.

In the above described semiconductor device, insulation layers are formed at the two sides of a drain region (the fourth semiconductor layer) and the drain region is formed into a deeper region than the insulation layer. By having the drain region come into contact with the drain drift region (the first semiconductor layer) at a portion beneath the insulation layer, the drift length can be shortened while ensuring a sufficient level of breakdown voltage.

In other words, by providing an insulation layer at a portion of the boundary between the drain region and the drain drift region (from the top of the first semiconductor layer extending to a required depth), the electric field applied to the drain-source regions is distributed with a high degree of uniformity within the above-mentioned insulation layer. Since the above structure is less prone to uneven electric field distribution, this allows a greater breakdown voltage for the device.

The structure of the semiconductor device of the present invention, as shown for example in FIG. 1, has an insulation layer to ensure the breakdown voltage by allowing the drift current to flow through the path (A-B-C) along the two sides of the insulation layer. The structure at the same time contributes to shortening the drain length, and therefore to reducing the on-resistance.

Since the design permits a drain length on a plane as projected laterally on the semiconductor substrate to be relatively short for a same required breakdown voltage, this enables a reduction in projected area of the drain drift region to accomplish a microminiaturization of the device.

Further, since the insulation layer is arranged to cover both sides of the drain region so as to block the impurity diffusion in the horizontal direction of the drain region, the doping level inside the drain region can be made sufficiently high. Consequently, the drain drift region, the drain region, and the drain electrode can be connected with a good ohmic contact.

While the drain region can be constituted of either a single layer or a multi-layer structure, considering the depth of the drain region, it is desirable to ensure a better ohmic contact be established, for example, by building a first drain region having a higher dopant concentration level near the region contacting the drain electrode, and a second drain region having a lower dopant concentration where it connects to the lightly doped drain drift region. Additionally, the ohmic contact can also be improved by causing a drain electrode to be formed to penetrate into the drain region.

The breakdown voltage in the aforementioned semiconductor device can be controlled by regulating the width and depth of the insulation layer.

Moreover, although there are no specific limitations for the structure of the insulated gate in the semiconductor device of the present invention, further microminiaturization can be achieved by designing the semiconductor device with a trench gate structure.

Specifically, it is desirable that the semiconductor device in the present invention contain a lateral MOS transistor which comprises:

a semiconductor substrate;

a drain drift region of a first conductive type formed on said semiconductor substrate;

an insulation layer disposed in a trench which is formed in said drain drift region by filling a trench with insulating material;

a drain region formed along one side of the insulation layer;

a body region of a second conductive type located on the other side of the insulation layer and formed in the drain drift region, the body region including a portion in which a channel region is formed;

a source region of the first conductive type formed on the surface of the body region; and a trench gate having a gate insulation layer formed along the surface of a trench boring through the source region, the body region and the drain drift region, and a gate electrode formed in the trench and arranged through the gate insulation layer;

wherein the drain region extends greater than the insulation layer in depth to contact the drain drift region below the insulation layer.

In the above described semiconductor device, the drift current mainly flows from a direction parallel to the main surface of the above-mentioned semiconductor substrate in a direction along the aforementioned gate insulation layer, thereby accomplishing further microminiaturization, in addition to the other effects described above.

Furthermore, the present invention can be applied to a semiconductor device using a substrate having an SOI (silicon on insulator) structure.

DETAILED DESCRIPTION OF THE PREFERRED EMBODIMENTS

Figure 1:
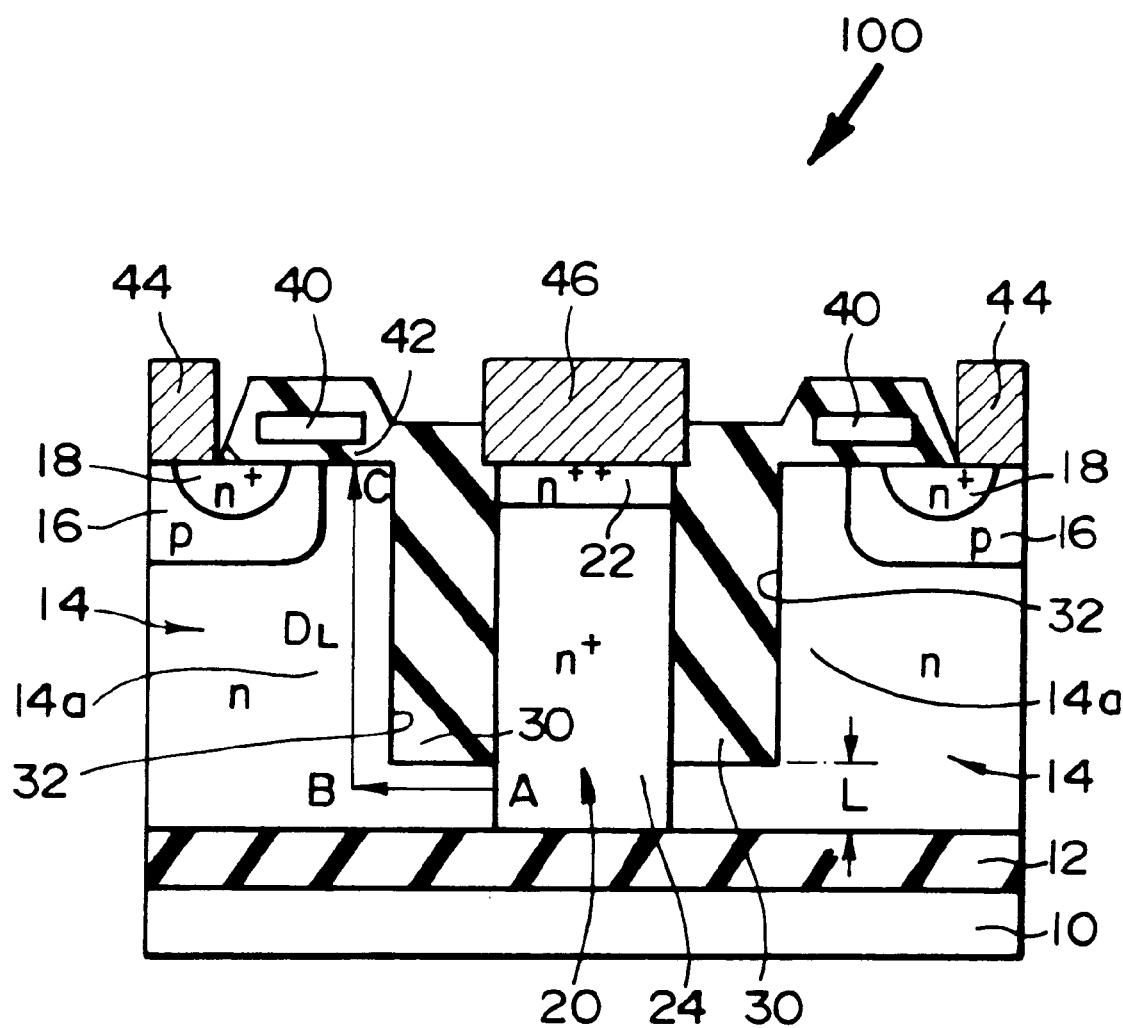
FIG. 1 is a cross-sectional view schematically illustrating a lateral power MOSFET configured with the planar gate structure of the first embodiment of the present invention.

In the following description, a more detailed explanation of preferred embodiments of this invention will be presented referring to the drawings provided herein.

First Embodiment

FIG. 1 is a cross-sectional view schematically illustrating an example of a semiconductor device wherein the present invention is applied to a lateral power MOSFET configured with a planar gate structure.

The semiconductor device 100 shown in FIG. 1 is based on an SOI structure. That is, the device comprises a silicon substrate 10, an insulating substrate 12 typically comprising silicon oxide or silicon nitride formed on the substrate 10, and a first semiconductor layer 14 doped with an n-type impurity to constitute a drain drift region 14a.

On the upper main surface of the first semiconductor layer 14 is located a p-type body region 16 (i.e. the second semiconductor layer) which is formed by diffusing a p-type impurity, and additionally, on top of the upper main surface of the body region 16, a source region 18 (i.e. the third semiconductor layer) is formed by selectively diffusing a high concentration of an n-type impurity. The body region 16 and the source region 18 are prepared by a double diffusion process using a self alignment technique.

In the above-mentioned first semiconductor layer 14, a drain region 20 (i.e. the fourth semiconductor layer) is formed at a location apart from the body region 16. The drain region 20 has a depth starting from the top of the first semiconductor layer 14 and extending to the surface of the insulating substrate 12 described in the above, and comprises two layers of different doping levels. The first drain region 22, the upper of the two, is formed on the surface of the first semiconductor layer 14, and doped with an n-type impurity of a considerably high concentration. The second drain region 24 located below the above-mentioned drain region 22 is doped with an n-type impurity of a concentration lower than that of the first drain region 22 but higher than that of the drain drift region 14a. The dopant concentrations for the drain regions 24 and 22 are selected so that good ohmic contact is established respectively with the drain drift region 14a and the drain electrode 46 which will be discussed later.

Formed on both sides of the aforementioned drain region 20 are insulation layers 30 comprising materials such as silicon oxide or silicon nitride. These insulation layers 30 are prepared so that their bottom ends are spaced at a predetermined distance, L from the aforementioned insulating substrate 12. The distance L is determined by the depths of insulation layers 30 and the body region 16, and more specifically, is regulated in relation to the on-resistance. The breakdown voltage of the device can be controlled by regulating the thickness and depth of the insulation layers 30. Further, the aforementioned body region 16 and the insulation layers 30 are required to be of the same depth, or the insulation layers 30 must be extended to a deeper position than the body region 16.

On the surface of the above-mentioned body region 16, a gate insulation layer 42 is deposited, whereupon a gate electrode 40 is formed. Separately, a source electrode 44 and a drain electrode 46 are formed on the top of the aforementioned source region 18 and the drain region 20, respectively.

The semiconductor device 100 of the present embodiment has a structure wherein the insulation layers 30 are interposed at the space where the channel region is to be formed, i.e. between the body region 16 and the drain region 20, and, in addition, the insulation layers 30 are formed to come in contact with the drain region 20. Since the breakdown voltage of the MOS transistor is supported by the insulation layers 30, an excessive drain drift region as in the prior art is no longer required.

As shown in FIG. 1, the drift length $D_L$ is constituted only of a two-way path (A-B-C) along the bottom surface and one side of the insulation layer. Since the above path does not involve the other sidewall of the insulation layer, the drift length $D_L$ can be shortened in comparison with the prior art example described earlier. Consequently, in addition to enabling a lower on-resistance commensurate with the reduced drift length $D_L$, the structure also provides for a smaller projected area required for drain drift region 14a which helps reduce the cell pitch upon fabrication.

As described above, the semiconductor device 100 in accordance with the present embodiment ensures a sufficient breakdown voltage for the device as supported by the insulation layers 30, thereby allowing the size of the drain drift region 14a as the determining factor of the breakdown voltage to be set to a minimum. These features, consequently, help materialize a high breakdown voltage, low on-resistance, lateral power MOSFET that can be fabricated with a reduced cell pitch.

(Fabrication Process)

In the following paragraphs, an example of the fabrication process for a semiconductor device of the present embodiment is described. FIG. 2A through FIG. 2D are cross-sectional views schematically illustrating the steps for fabricating the semiconductor device.

Figure 2A:
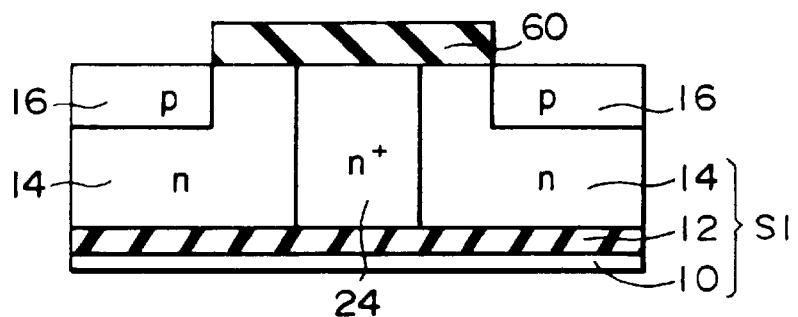
FIG. 2A through FIG. 2D are cross-sectional views schematically describing the sequential steps to fabricate the MOSFET shown in FIG. 1.

Referring to FIG. 2A, a thermal oxide layer 60 having a thickness of 100 to 500 nm is first formed on an SOI substrate S1 comprising a silicon substrate 10, an insulating substrate 12, and an n-type semiconductor layer 14. Subsequently, an opening is prepared by conventional processes of photolithography and Reactive Ion Etching ("RIE") at a position on the oxide film where the impurity is to be implanted. Then a second drain region 24 doped with an n-type impurity of a high concentration is formed by conventional processes of ion implantation and heat treatment (thermal diffusion). A body region 16 doped with a p-type impurity is formed in a similar fashion. Note here that the forming processes for the aforementioned regions are not restricted to a particular order, and the above sequence for the body region 16 and the second drain region 24 may be reversed.

No particular limitations exist in the method for preparing the SOI substrate S1, which may be fabricated by any usual procedures adopted in the art. For example, the SOI substrate S1 may be prepared by forming an insulating substrate 12 comprising such a material as $SiO_2$, $Si_3N_4$, or the like, on a silicon substrate 10, and depositing either polycrystalline silicon (polysilicon) or amorphous silicon on the insulating substrate 12. The above silicon layer is then melted by irradiation of an energy beam such as an electron beam or a laser beam, the melted silicon forming a semiconductor layer 14 through recrystallization in a subsequent cooling process.

Figure 2B:
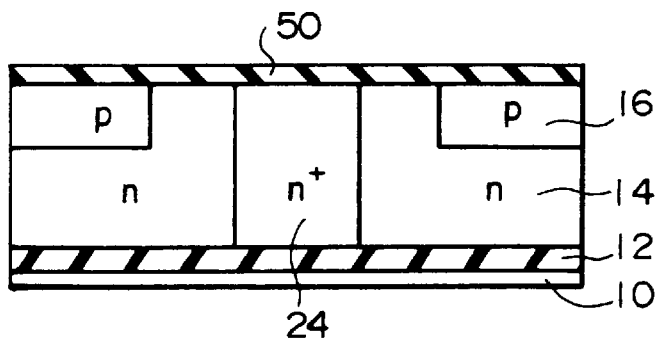

After removing the oxide layer 60, as shown in FIG. 2B, a field oxide layer 50 having a thickness of 100 to 500 nm is formed by a thermal oxidation or a chemical vapor deposition ("CVD") method.

Figure 2C:
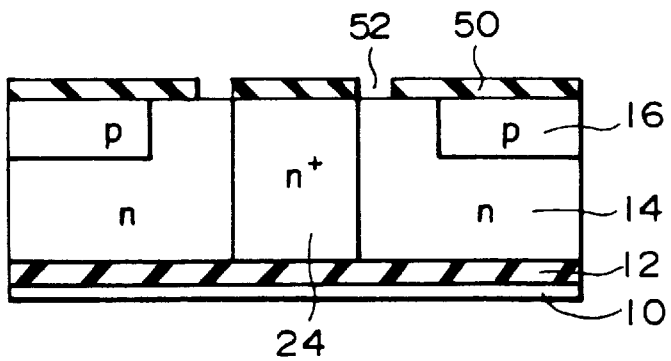

In FIG. 2C, openings 52 for forming the trenches are etched in the field oxide layer by photolithography and RIE.

Figure 2D:
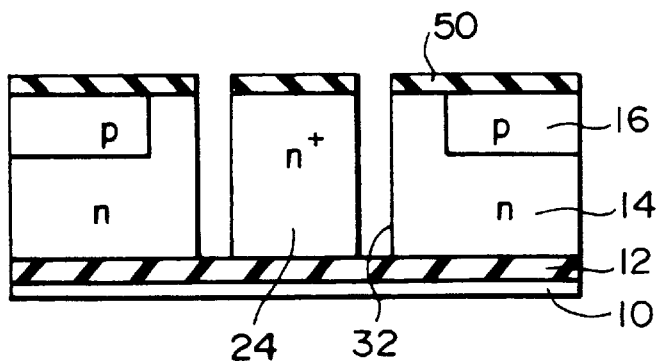

In FIG. 2D, trenches 32 are formed with a depth reaching the surface of the above-mentioned insulating substrate 12, typically 2.0 $\mu$m or more.

Figure 3A:
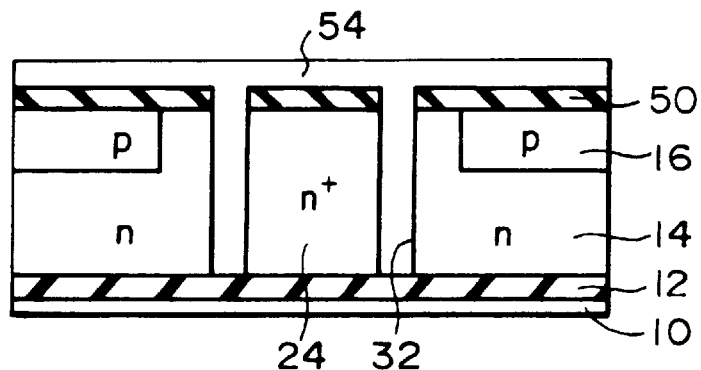
FIG. 3A through FIG. 3D are cross-sectional views schematically showing the sequential steps that follow the step shown in FIG. 2D, to fabricate the above MOSFET.

In FIG. 3A, a polysilicon layer 54 containing an n-type impurity is formed inside the aforementioned trenches 32 by depositing polysilicon doped with an n-type impurity such as phosphorus or arsenic. The doping concentration used in this step is set at the same level or higher than the aforementioned n-type semiconductor layer 14.

Figure 3B:
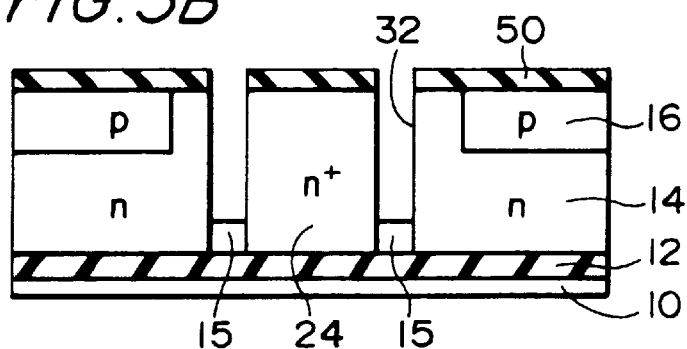

Subsequently, as shown in FIG. 3B, the polysilicon layer 54 formed in the previous step is etched with RIE so that the layer 54 is left with a desired thickness L (see FIG. 1), typically 0.3 to 2.0 $\mu$m in the vertical direction, to form an embedded drain drift region 15. Having a doped polysilicon layer embedded inside the trenches 32 so that it forms a part of the drain drift region which is in contact with the drain region provides an advantage in lowering the resistance component of the drain drift region.

Figure 3C:
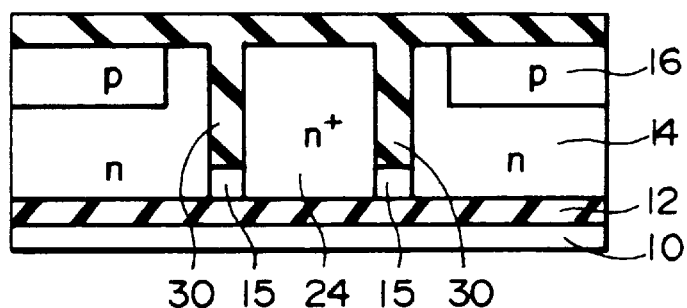

Next, in FIG. 3C, an insulation layer 30 is formed by further depositing silicon oxide inside the trenches 32 using a CVD process. The insulation layer 30 is formed to a thickness of ½ W or more in proportion to the opening width W of the trench 32. For example, if the trench 32 has a width of 1 $\mu$m, the oxide layer is set at a thickness of 0.5 $\mu$m or more.

Figure 3D:
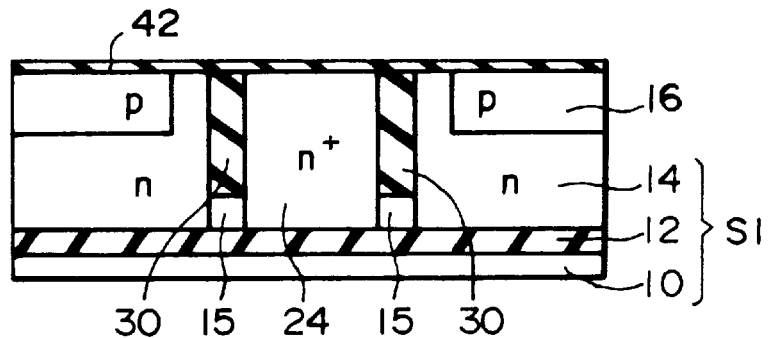

In FIG. 3D, a gate insulation layer 42 is formed after removing the oxide layer on the SOI substrate S1.

Figure 4A:
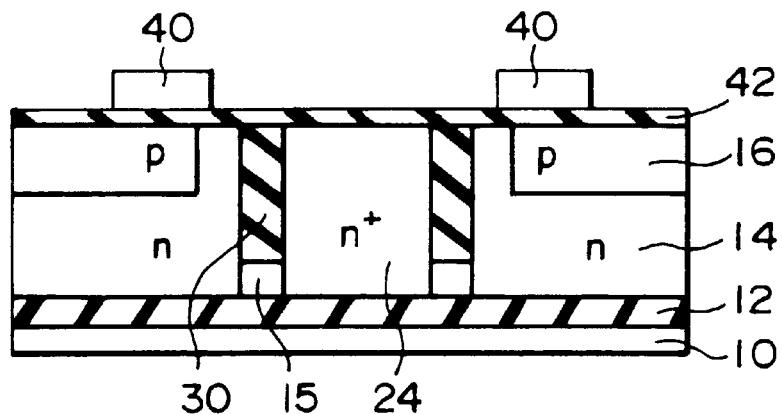
FIG. 4A through FIG. 4C are cross-sectional views schematically illustrating the sequential steps that follow the step shown in FIG. 3D, to fabricate the above MOSFET.

In FIG. 4A, a gate electrode 40 comprising, for example, doped polysilicon is formed over the gate insulation layer 42.

Figure 4B:
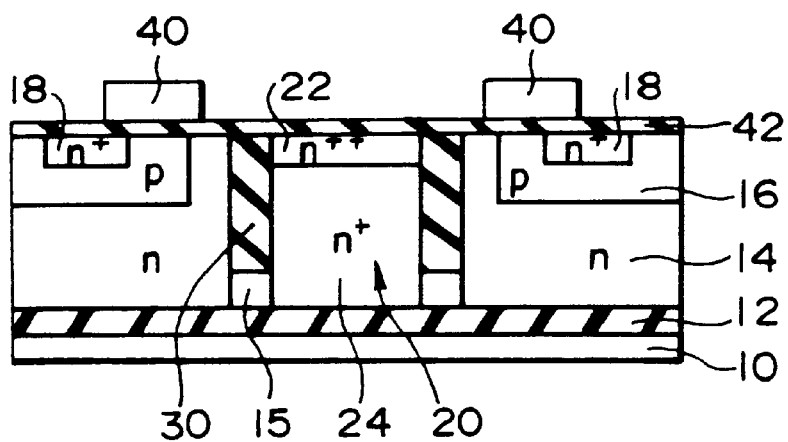
Figure 4C:
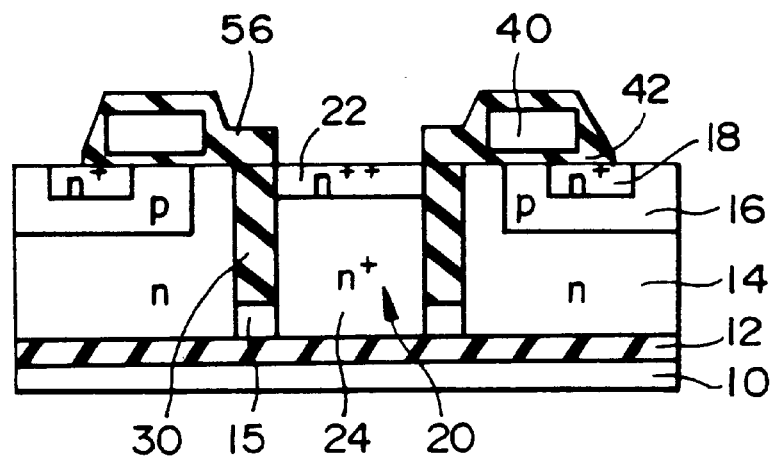

In FIG. 4B, a source region 18 containing a high concentration of an n-type impurity is formed with ion implantation and thermal diffusion processes. At this time, a first drain region 22 with a higher dopant concentration than the second drain region 24 is created as the n-type dopant is concurrently implanted into the surface of the second drain region 24. These first and second drain regions constitute the entire drain region 20.

Subsequently, after depositing an intermediary dielectric layer 56 having a thickness of 0.2 to 1 $\mu$m and comprising materials such as silicon oxide, BPSG (boron-phosphorus-silicate glass) and the like, using a CVD process, contact holes having required patterns are prepared. Following this, although not shown in the drawings, a source electrode 44 and a drain electrode 46 are built on top of the source region 18 and drain region 20, respectively.

Thus, a semiconductor device 100 as illustrated in FIG. 1 can be fabricated through the above-mentioned steps.

Second Embodiment

Figure 5:
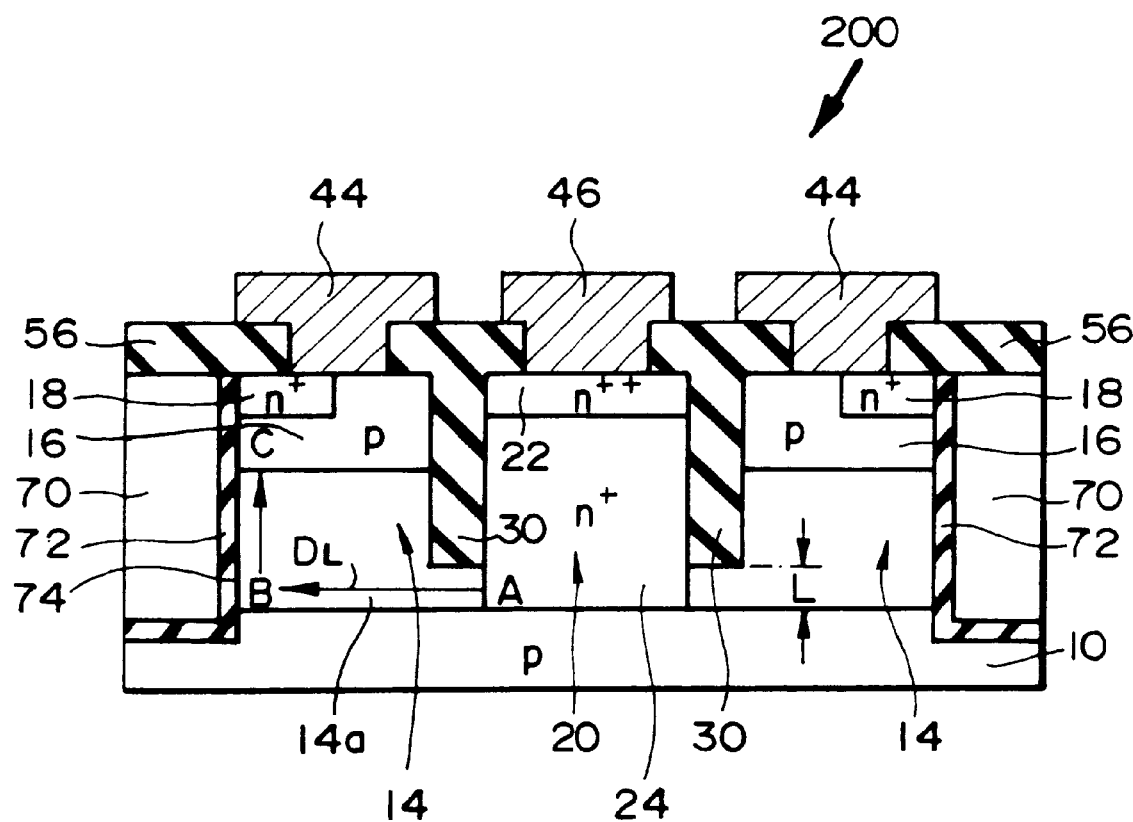
FIG. 5 is a cross-sectional view schematically illustrating a lateral power MOSFET configured with the trench gate structure of the second embodiment of the present invention.

FIG. 5 is a cross-sectional view schematically illustrating an example of a semiconductor device wherein the present invention is applied to a lateral power MOSFET configured with a trench gate structure. In describing this embodiment, constituent parts having functions essentially identical to those used in the semiconductor device 100 of the first embodiment will be indicated using the same symbols.

The semiconductor device 200 shown in FIG. 5 comprises a silicon substrate 10 and a first semiconductor layer 14 that is doped with an n-type impurity and formed on the substrate 10 to constitute a drain drift region 14a.

On the upper main surface of the first semiconductor layer 14 there is located a p-type body region 16 (the second semiconductor layer) which is formed by diffusing a p-type impurity. In addition, on the upper main surface of the body region 16, a source region 18 (the third semiconductor layer) is formed by selectively diffusing a high concentration of an n-type impurity. The body region 16 and the source region 18 are prepared by a double diffusion process using a self alignment technique.

In the above-mentioned first semiconductor layer 14, a drain region 20 (the fourth semiconductor layer) is formed at a location apart from the body region 16. The drain region 20 has a depth starting from the top of the first semiconductor layer 14 and extending to the surface of the substrate 10, and comprises two layers having different dopant concentrations. The first and upper drain region 22 is formed on the surface of the first semiconductor layer 14, and doped with an n-type impurity of a considerably high concentration. The second drain region 24 located below the above-mentioned drain region 22 is doped with an n-type impurity of a concentration lower than that of the first drain region 22 but higher than that of the drain drift region 14a. The dopant concentrations for the drain regions 24 and 22 are chosen so that good ohmic contact is established respectively with the drain drift region 14a and the drain electrode 46 which is discussed later.

Formed on both sides of the aforementioned drain region 20 are insulation layers 30 comprising a material such as silicon oxide or silicon nitride. These insulation layers 30 are prepared so that their bottom ends are spaced at a predetermined distance L from the substrate 10. Such a distance L is determined based on the same principles as in the first embodiment already described. The breakdown voltage of the device can be controlled by regulating the thickness and depth of the insulation layers 30.

A feature of the present embodiment is that the device has a trench gate structure. Namely, a gate insulation layer 72 is formed along the surface of a trench 74 that is bored from the top through the bottom surface of the first semiconductor layer 14 and extended to reach the silicon substrate 10. A gate electrode 70 is then formed within the trench and arranged inside the gate insulation layer 72. By building the trench 74 deep into the silicon substrate 10 so that the bottom corner of the gate insulation layer 72 is inside the silicon substrate 10, a further increase of the breakdown voltage over a conventional design can be accomplished.

Separately, a source electrode 44 and a drain electrode 46 are formed on the aforementioned source region 18 and the drain region 20, respectively.

The semiconductor device of the present embodiment has a structure wherein the insulation layers 30 are interposed at the space where the channel region is to be formed, i.e. between the body region 16 and the drain region 20, and at the same time the insulation layers 30 are formed in contact with the drain region 20. Since the breakdown voltage of the MOS transistor is supported by the insulation layers 30, the excessive drain drift region as in the prior art is not necessary. In other words, as shown in FIG. 5, the drift length $D_L$ is constituted only of a two-way path (A-B-C) along the bottom surface of the first semiconductor layer 14 and one side of the gate electrode 70. Since the above path does not involve another side, the drift length $D_L$ can be shortened in comparison with the three-way path (A-B-C-D) of prior art described earlier with reference to FIG. 12. As a result, in addition to enabling a lower on-resistance commensurate with the reduced drift length $D_L$, the structure also provides for a reduction in the cell pitch because of the comparatively smaller projected area required for the drain drift region 14a.

Moreover, since the channel region is positioned vertically against the silicon substrate 10, the trench gate structure makes a further microminiaturization compared to a planer gate structure.

As described above, the semiconductor device 200 in accordance with the present embodiment ensures a sufficient breakdown voltage for the device as supported by the insulation layers 30, which in return allows the size of drain drift region 14a as the determining factor of the breakdown voltage to be set to a minimum. These features, consequently, help materialize a high breakdown voltage, low on-resistance, lateral power MOSFET and its fabrication with a reduced cell pitch.

EXPERIMENTAL EXAMPLE

To verify that the semiconductor device of the present embodiment can in fact lower the on-resistance, a computer simulation has been conducted with results as described below. Upon performing the simulation, the dimensions and operating specifics for a semiconductor device configured as in FIG. 5 were set as follows:

Insulation layer 30; thickness 0.5 μm, depth 2 μm

Figure 12:
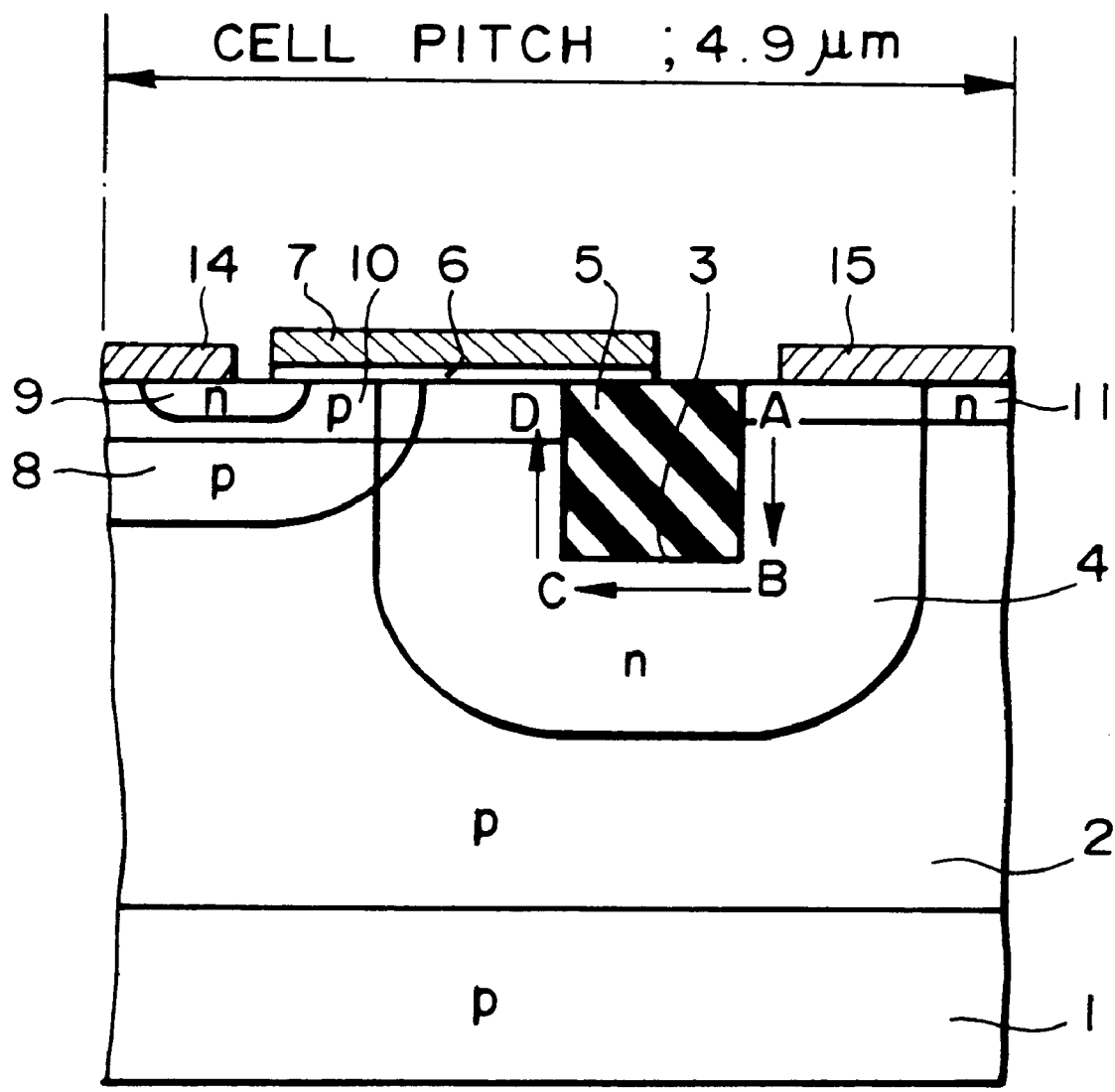
FIG. 12 is a cross-sectional view showing a lateral power MOSFET of the prior art.

First semiconductor layer (epitaxial layer) 14; thickness 3 μm, n-type dopant level $1 \times 10^{15}$ cm$^{-3}$ Body region 16; depth 2.5 μm, p-type surface dopant level $1 \times 10^{18}$ cm$^{-3}$ Source region 18; depth 0.5 μm, width 0.5 μm, n-type surface dopant level $2 \times 10^{19}$ cm$^{-3}$ Gate insulation layer 72; thickness 0.1 μm Trench gate; depth (for the trench 72) 3 μm Further, an analogous simulation has been performed on a prior art device configured as shown in FIG. 12 for comparison purposes. As a result, it has been verified that the specific on-resistance in the prior art device of 80 mΩ·mm$^2$ can be reduced to 40 mΩ·mm$^2$ in the device according to the present embodiment.

(Fabrication Process)

In the following paragraphs, an example of a fabrication process for a semiconductor device of the present embodiment is described. FIG. 6A through FIG. 6D are cross-sectional views schematically illustrating the steps to fabricate the semiconductor device.

Figure 6A:
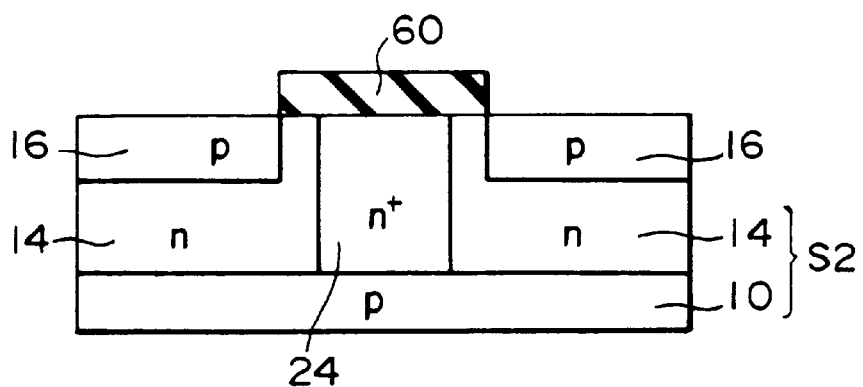
FIG. 6A through FIG. 6D are cross-sectional views schematically describing the sequential steps to fabricate the MOSFET shown in FIG. 5.

Referring to FIG. 6A, a thermal oxide layer 60 having a thickness of 100 to 500 nm is first grown on a substrate S2 comprising a silicon substrate 10 and an n-type semiconductor layer 14 formed using an epitaxial growth process. Subsequently, an opening is etched by conventional processes of photolithography and RIE at a position on the oxide film where the impurity is to be diffused. Then a second drain region 24 doped with an n-type impurity of a high concentration is formed by conventional processes of ion implantation and heat treatment (thermal diffusion). A body region 16 doped with a p-type impurity is formed in a similar fashion. It should be noted here that the forming processes for the aforementioned regions are not restricted to a particular order, and the above sequence for the body region 16 and the second drain region 24 may be reversed.

Figure 6B:
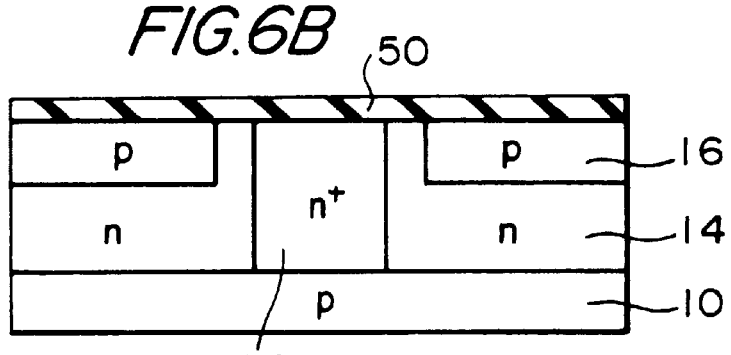

Subsequently, as shown in FIG. 6B, after removing the oxide layer 60, a field oxide layer 50 having a thickness of 100 nm or more is formed by a thermal oxidation or a CVD method.

Figure 6C:
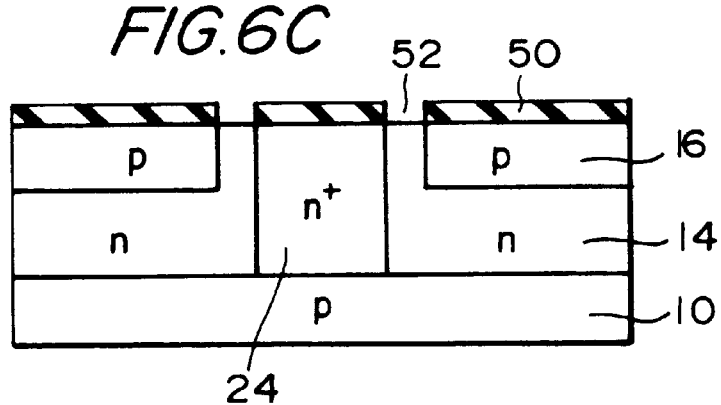

In FIG. 6C, openings 52 for forming the trenches are etched in the field oxide layer by photolithography and RIE.

Figure 6D:
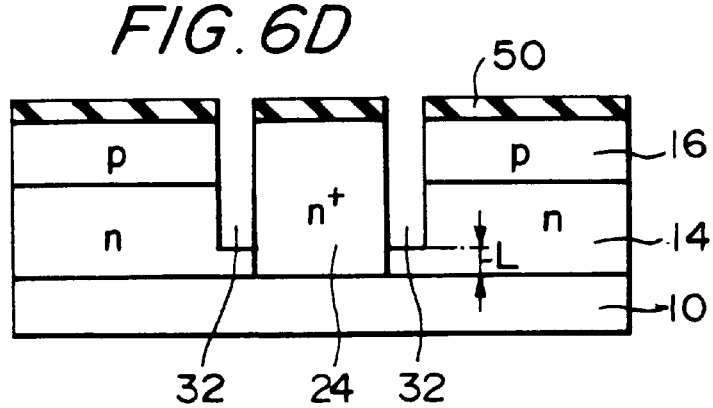

Next, in FIG. 6D, trenches 32 are etched with an RIE process to a depth leaving a required distance L, typically 2.0 μm or more, from the surface of the above-mentioned silicon substrate 10.

Figure 7A:
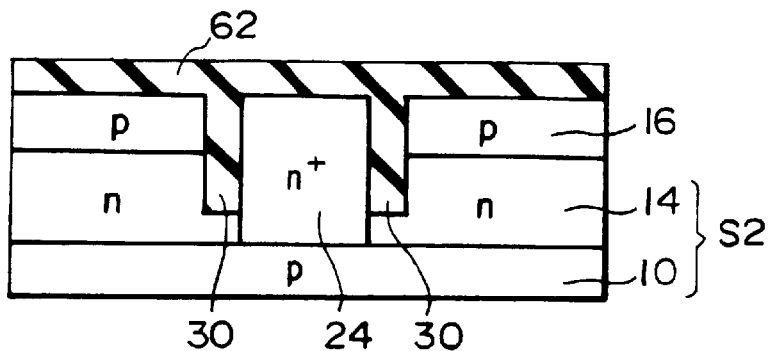
FIG. 7A through FIG. 7D are cross-sectional views schematically showing the sequential steps that follow the step shown in FIG. 6D, to fabricate the above MOSFET.

In FIG. 7A, an insulation layer 30 is prepared inside the above-mentioned trench 32 by filling in an insulating material such as silicon oxide or silicon nitride using a CVD process. The layer 30 thus isolates the body region 16 and the drain region 24. At the same time, an insulation layer 62 is formed on the substrate S2 in this step.

Figure 7B:
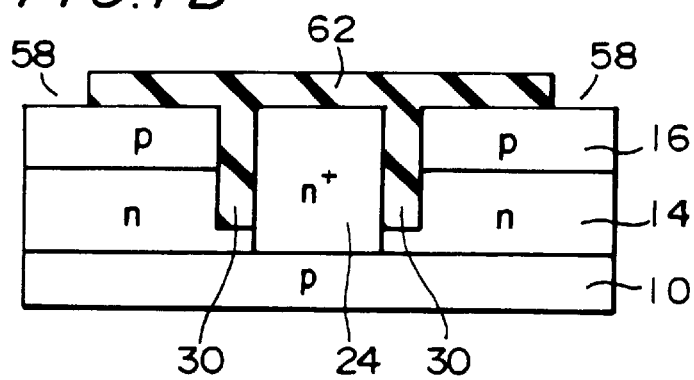

In FIG. 7B, in the insulation layer 62 that has been formed in the previous step, openings 58 for forming trenches are etched through photolithography and RIE processing.

Figure 7C:
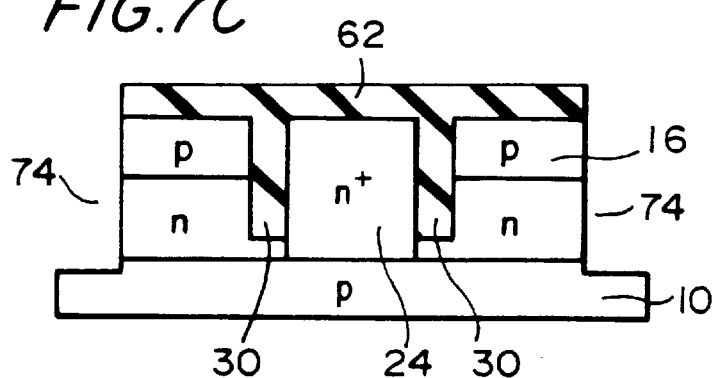

Subsequently, as shown in FIG. 7C, trenches 74 are prepared by RIE to a depth reaching the surface or inside the silicon substrate 10.

Figure 7D:
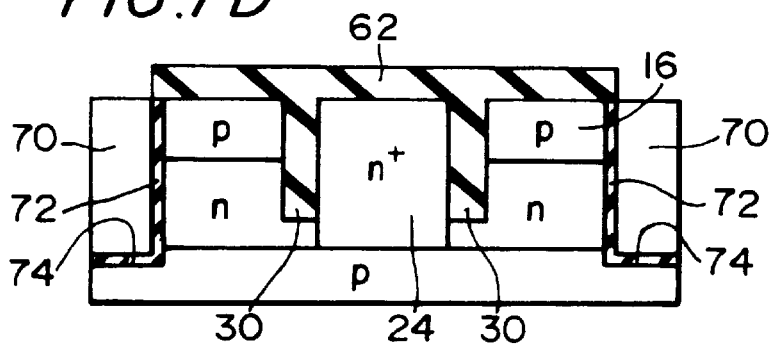

In FIG. 7D, after forming a gate insulation layer 72 with a thickness of 0.01 to 0.2 μm on the inner surface of the trenches 74, gate electrodes 70 are formed inside the trenches 74, by a CVD deposition of either amorphous silicon or polysilicon, both doped with an n-type impurity.

Figure 8A:
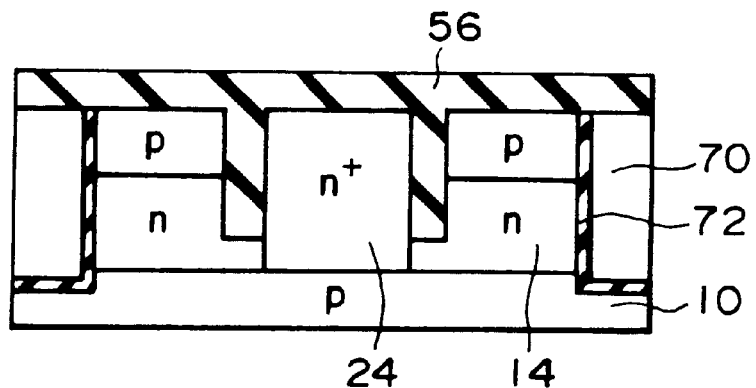
FIG. 8A through FIG. 8C are cross-sectional views schematically illustrating the sequential steps that follow the step shown in FIG. 7D, to fabricate the above MOSFET.

Subsequently, as shown in FIG. 8A, an intermediary dielectric layer 56 having a thickness of 0.2 to 1 μm and typically comprising silicon oxide, a BPSG layer, or the like, is formed using a CVD process after removing the insulation layer 62 from the substrate S2.

Figure 8B:
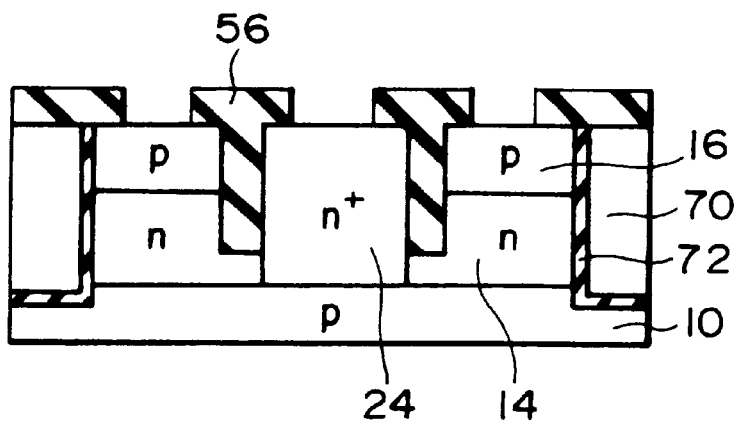

In FIG. 8B, contact holes for forming electrodes are prepared in the required patterns.

Figure 8C:
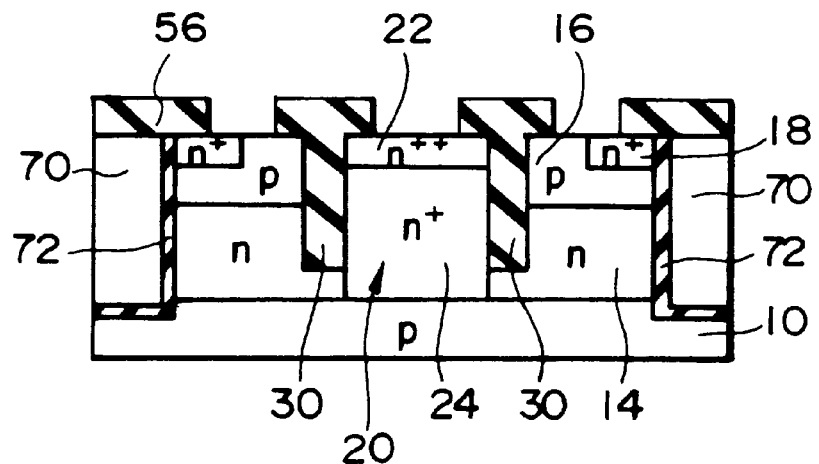

In FIG. 8C, a source region 18 containing a high concentration of an n-type impurity is formed with ion implantation and thermal diffusion processes. At this time, a first drain region 22 having a higher dopant concentration than the second drain region 24 is created as the n-type dopant is concurrently introduced into the topmost portion of the second drain region 24. These first and second drain regions constitute the entire drain region 20.

Following the above, although not shown in the drawings, a source electrode 44 and a drain electrode 46 are built on the source region 18 and drain region 20, respectively.

Note that the forming processes for the insulation layers 30 and the gate electrodes 70 are not restricted to a particular order, and the sequence described above may be reversed.

Thus, a semiconductor device 200 as illustrated in FIG. 5 can be fabricated through the above-mentioned steps.

Third Embodiment

Figure 9:
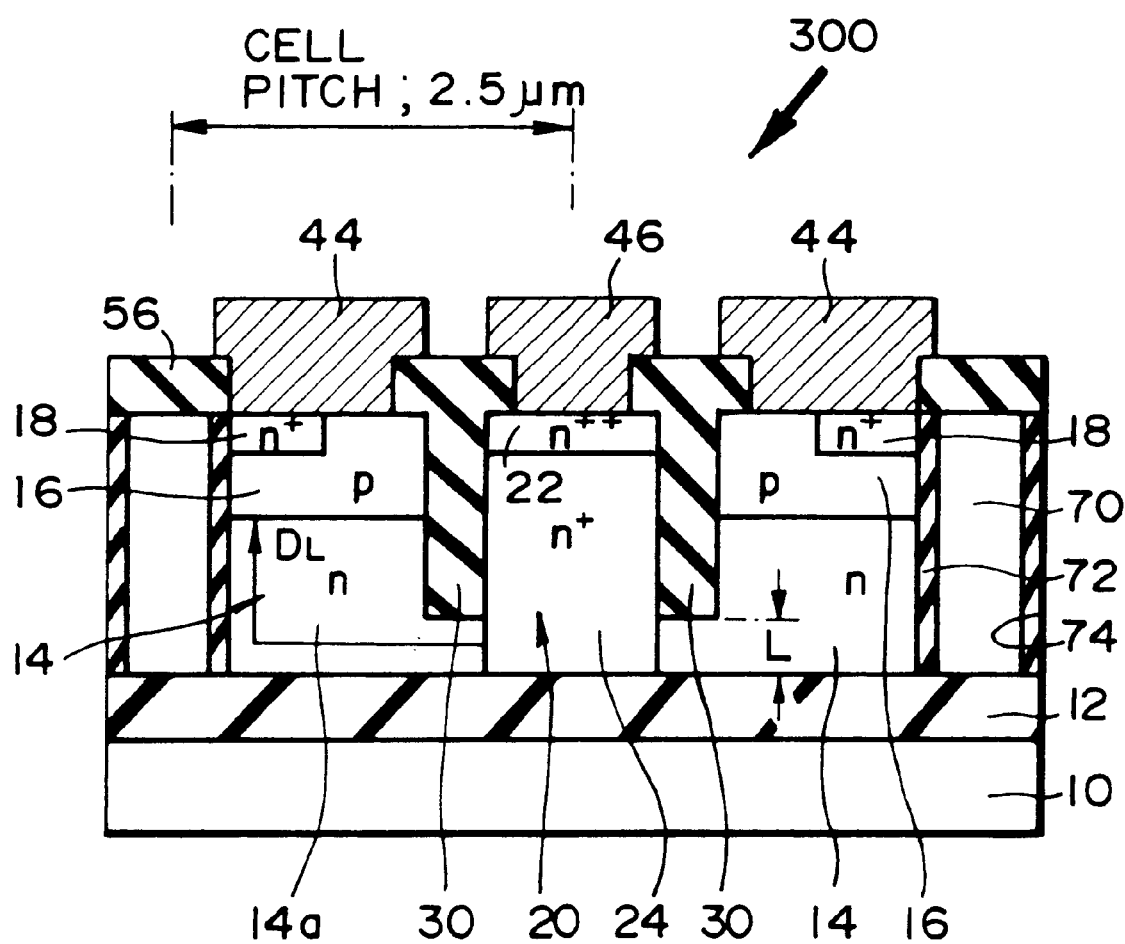
FIG. 9 is a cross-sectional view schematically illustrating a lateral power MOSFET configured with the trench gate structure of the third embodiment of the present invention.

FIG. 9 is a cross-sectional view schematically illustrating an example of a semiconductor device wherein the present invention is applied to a lateral power MOSFET configured with a trench gate structure. The semiconductor device of the present embodiment is similar to the aforementioned second embodiment except it has an SOI structure. Constituent parts providing functions essentially identical to those used in the semiconductor of the second embodiment will be indicated with the same symbols.

The semiconductor device 300 shown in FIG. 9 comprises a silicon substrate 10, an insulating substrate 12, and a first semiconductor layer 14 doped with an n-type impurity and formed on the insulating substrate 12 to constitute a drain drift region 14a. Description with regard to the SOI structure is omitted here as it has been dealt with in the first embodiment.

On the upper main surface of the first semiconductor layer 14 there is located a p-type body region 16 (the second semiconductor layer) which is formed by diffusing a p-type impurity, and additionally, on top of the upper main surface of the body region 16, a source region 18 (the third semiconductor layer) is formed by selectively diffusing a high concentration of an n-type impurity. The body region 16 and the source region 18 are prepared by a double diffusion process using a self alignment technique.

In the above-mentioned first semiconductor layer 14, a drain region 20 (the fourth semiconductor layer) is formed at a location apart from the body region 16. The drain region 20 has a depth starting from the top of the first semiconductor layer 14 and extending to the surface of the insulating substrate 12, and comprises two layers of different dopant concentrations. The first and upper drain region 22 is formed on the surface of the first semiconductor layer 14, and is doped with an n-type impurity of a considerably high concentration. The second drain region 24 located below the above-mentioned drain region 22 is doped with an n-type impurity of a concentration lower than that of the first drain region 22 but higher than that of the drain drift region 14a. The dopant concentration for the drain regions 24 and 22 are chosen so that good ohmic contact is established respectively with the drain drift region 14a and the drain electrode 46 which is discussed later.

Formed on both sides of the aforementioned drain region 20 are insulation layers 30 comprising a material such as silicon oxide or silicon nitride. These insulation layers 30 are prepared so that their bottom ends are spaced at a predetermined distance L from the insulating substrate 12. Such a distance L is determined according to the same principles as in the first embodiment described previously. The breakdown voltage of the device can be controlled by regulating the film thickness and depth of the insulation layers 30.

The semiconductor device of the present embodiment has a trench gate structure. Namely, a gate insulation layer 72 is formed along the surface of a trench 74 that is bored from the top through the bottom surface of the first semiconductor layer 14 and extended to reach the insulating substrate 12. A gate electrode 70 is then formed inside the gate insulation layer 72. Since the trench gate structure of the present embodiment ends exactly at the insulating substrate 12, the gate insulation layer 72 has no corner. This design thus provides an advantage of not causing a deterioration in breakdown voltage at the trench gate section, when a drain-source voltage is applied.

Additionally, a source electrode 44 and a drain electrode 46 are formed on the aforementioned source region 18 and the drain region 20, respectively.

The semiconductor device of the present embodiment has a structure wherein the insulation layers 30 are interposed in the space where the channel region is to be formed, i.e. between the body region 16 and the drain region 20, and, in addition, the insulation layers 30 are formed in contact with the drain region 20. Since the breakdown voltage of the MOS transistor is supported by the insulation layers 30, the structure does not require an excessive drain drift region such as in the prior art. As shown in FIG. 9, the drift length $D_L$ is constituted only of a two-way path along the bottom surface of the first semiconductor layer 14 and one side of the gate electrode 70. Since the above path does not involve another side, the drift length $D_L$ can be shortened in comparison with the three-way path of prior art described with reference to FIG. 12. As a result, in addition to enabling a lower on-resistance commensurate with the reduced drift length $D_L$, the structure also ensures microminiatuarization of the cell because of the comparatively smaller projected area required for drain drift region 14a.

Moreover, since the channel region is positioned vertically against the silicon substrate 10, the trench gate structure makes a further reduction in the cell pitch possible compared with a planer gate structure.

It is noted in this connection that, when compared on the basis of similar breakdown voltages, the cell pitch of a sample semiconductor device in accordance with the present embodiment is 2.5 μm, whereas the device shown in FIG. 12 had a cell pitch of 4.9 μm.

As described above, the semiconductor device 300 in accordance with the present embodiment ensures a sufficient breakdown voltage for the device as supported by the insulation layers 30, which in return allows the size of drain drift region 14a as the determining factor of the breakdown voltage to be set to a minimum. These features, consequently, help materialize a low on-resistance, high breakdown voltage, lateral power MOSFET and its fabrication with a reduced cell pitch.

Fourth Embodiment

Figure 10:
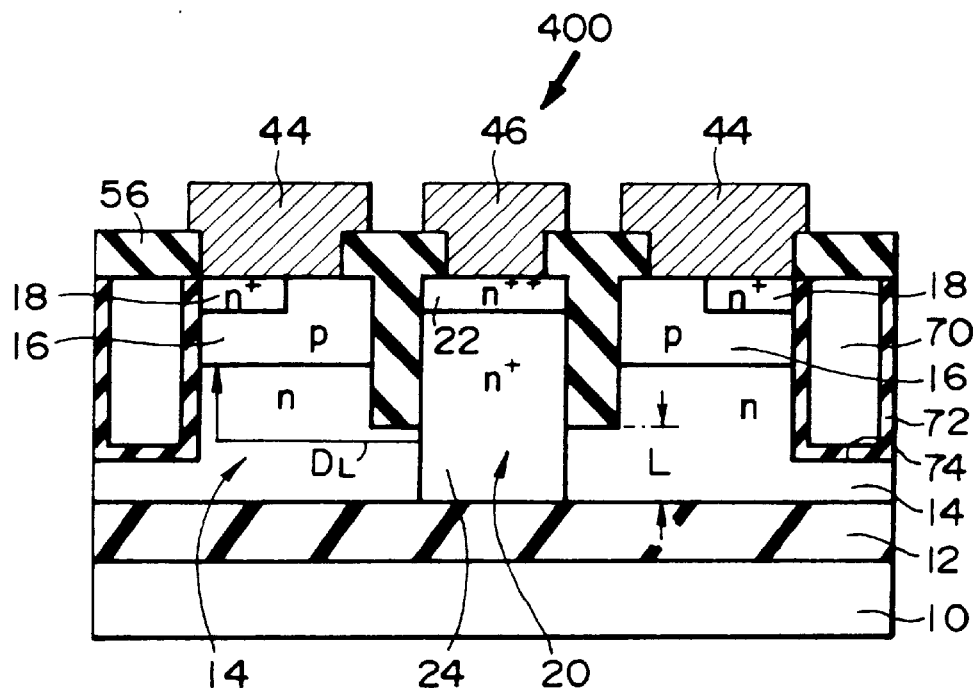
FIG. 10 is a cross-sectional view schematically showing a lateral power MOSFET configured with the trench gate structure of the fourth embodiment of the present invention.

FIG. 10 is a cross-sectional view schematically illustrating an example of a semiconductor device wherein the present invention is applied to a lateral power MOSFET configured with a trench gate structure. The semiconductor device of the present embodiment is similar to the aforementioned second embodiment with exception that it has an SOI structure and a different system for trench isolation. Constituent parts providing functions essentially identical to those used in the semiconductor of the second embodiment will be indicated with the same symbols.

The semiconductor device 400 shown in FIG. 10 comprises a silicon substrate 10, an insulating substrate 12, and a first semiconductor layer 14 doped with an n-type impurity and formed on the insulating substrate 12 to constitute a drain drift region 14a. Description with regard to the SOI structure is omitted here as it has been dealt with in the first embodiment.

On the upper main surface of aforementioned first semiconductor layer 14 there is located a p-type body region 16 (the second semiconductor layer) which is formed by diffusing a p-type impurity. In addition, on the upper main surface of the body region 16, a source region 18 (the third semiconductor layer) is formed by selectively diffusing a high concentration of an n-type impurity. These body region 16 and source region 18 are prepared by a double diffusion process using a self alignment technique.

In the above-mentioned first semiconductor layer 14, a drain region 20 (the fourth semiconductor layer) is formed at a location apart from the body region 16. The drain region 20 has a depth starting from the top of the first semiconductor layer 14 and extending to the surface of the insulating substrate 12, and comprises two layers of different doping levels. The first and upper drain region 22 is formed on the surface of the first semiconductor layer 14, and is doped with an n-type impurity of a considerably high concentration. The second drain region 24 located below the drain region 22 is doped with an n-type impurity of a concentration lower than that of the first drain region 22 but higher than that of the drain drift region 14a. The dopant concentrations for the drain regions 24 and 22 are chosen so that good ohmic contact is established respectively with the drain drift region 14a and the drain electrode 46 which is discussed later.

Formed on both sides of the aforementioned drain region 20 are insulation layers 30 comprising a material such as silicon oxide or silicon nitride. These insulation layers 30 are prepared so that their bottom ends are spaced at a predetermined distance L from the insulating substrate 12. Such a distance L is determined by the same principles as in the first embodiment described previously. The breakdown voltage of the device can be controlled by regulating the thickness and depth of the insulation layers 30.

The semiconductor device of the present embodiment has a trench gate structure. Namely, a gate insulation layer 72 is formed along the surface of a trench 74 that is bored from the top of the first semiconductor layer 14 and extended to a depth leaving a certain required distance from the insulating substrate 12. A gate electrode 70 is then formed inside the gate insulation layer 72. The trench gate structure of the present embodiment is arranged so that its bottom end does not reach the insulating substrate 12.

Additionally, a source electrode 44 and a drain electrode 46 are formed on top of the source region 18 and the drain region 20, respectively.

The semiconductor device of the present embodiment has a structure wherein the insulation layers 30 are interposed in the space where the channel region is to be formed, i.e. between the body region 16 and the drain region 20, and, in addition, the insulation layers 30 are formed in contact with the drain region 20. Since the breakdown voltage of the MOS transistor is supported by the insulation layers 30, the structure does not require an excessive drain drift region as in the prior art. As shown in FIG. 10, the drift length $D_L$ is constituted only of a two-way path along the bottom surface of the first semiconductor layer 14 and one side of the gate electrode 70. Since the above path does not involve another side, the drift length $D_L$ can be shortened in comparison with the three-way path of prior art described earlier with reference to FIG. 12. As a result, in addition to enabling a lower on-resistance commensurate with the reduced drift length $D_L$, the structure also provides for microminiaturization of the device because of the comparatively smaller projected area required for drain drift region 14a.

Moreover, since the channel region is positioned vertically against the silicon substrate 10, the trench gate structure makes a further microminiaturization compared with a planer gate structure.

As described above, the semiconductor device 400 in accordance with the present embodiment ensures a sufficient breakdown voltage for the device as supported by the insulation layers 30, which in return allows the size of the drain drift region 14a as the determining factor of the breakdown voltage to be set to a minimum. These features, consequently, help materialize a low on-resistance, high breakdown voltage, lateral power MOSFET, and microminiaturization of the device.

Fifth Embodiment

Figure 11:
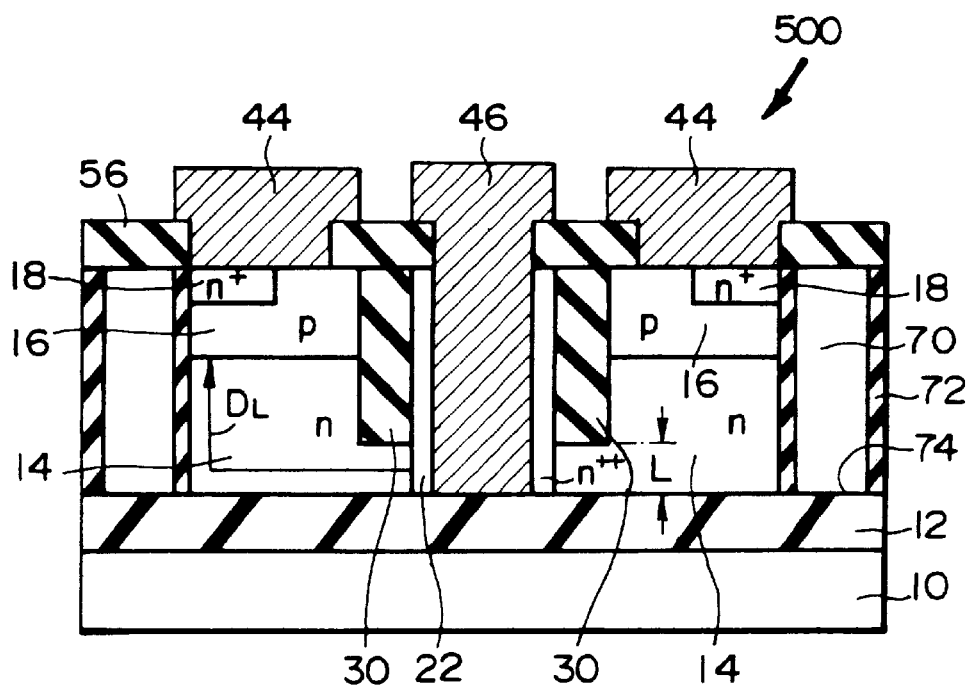
FIG. 11 is a cross-sectional view schematically illustrating a lateral power MOSFET configured with the trench gate structure of the fifth embodiment of the present invention.

FIG. 11 is a cross-sectional view schematically illustrating an example of a semiconductor device wherein the present invention is applied to a lateral power MOSFET configured with a trench gate structure. The semiconductor device of the present embodiment is structured similarly to the aforementioned second embodiment with exception that it is based on an SOI structure and a different configuration for the drain electrode. Constituent parts providing functions essentially identical to those used in the semiconductor of the second embodiment will be indicated with the same symbols.

The semiconductor device 500 shown in FIG. 11 comprises a silicon substrate 10, an insulating substrate 12, and a first semiconductor layer 14 doped with an n-type impurity and formed on the insulating substrate 12 to constitute a drain drift region 14a. Description with regard to the SOI structure is omitted here as it has been dealt with in the first embodiment.

On the upper main surface of aforementioned first semiconductor layer 14 there is located a p-type body region 16 (the second semiconductor layer) which is formed by diffusing a p-type impurity. In addition, on the upper main surface of the body region 16, a source region 18 (the third semiconductor layer) is formed by selectively diffusing a high concentration of an n-type impurity. The body region 16 and the source region 18 are prepared by a double diffusion process using a self alignment technique.

In the above-mentioned first semiconductor layer 14, a drain region 22 (the fourth semiconductor layer) is formed at a location apart from the body region 16. The drain region 22 has a depth starting from the top of the first semiconductor layer 14 and extending to the surface of the insulating substrate 12. The drain region 22 is doped with an n-type impurity of a considerably high concentration, which is chosen so that good ohmic contact is established with the drain electrode 46 which is discussed later.

Formed on both sides of the drain region 20 are insulation layers 30 comprising a material such as silicon oxide or silicon nitride. These insulation layers 30 are prepared so that their bottom ends are spaced at a predetermined distance L from the insulating substrate 12. Such a distance L is determined by the same principles as in the first embodiment described previously. The breakdown voltage of the device can be controlled by regulating the thickness and depth of the insulation layers 30.

The semiconductor device of the present embodiment has a trench gate structure. Namely, a gate insulation layer 72 is formed along the surface of a trench 74 that is bored from the top through the bottom surface of the first semiconductor layer 14 and extended to reach the insulating substrate 12. A gate electrode 70 is then formed inside the gate insulation layer 72. Additionally, a source electrode 44 is formed on the aforementioned source region 18.

A feature of the present embodiment is that it has a drain electrode 46 built in roughly in the center of the drain region 20, for a length from the top through the bottom of the first semiconductor layer 14 until it meets the insulating substrate 12. Arranging the drain electrode 46 inside the drain region 20 in the above fashion enables a better ohmic contact to be established.

The semiconductor device of the present embodiment has a structure wherein the insulation layers 30 are interposed at the space where the channel region is to be formed, i.e. between the body region 16 and the drain region 20, and, in addition, the insulation layers 30 are formed in contact with the drain region 20. Since the breakdown voltage of the MOS transistor is supported by the insulation layers 30, the structure does not require an excessive drain drift region as in the prior art. As shown in FIG. 11, the drift length $D_L$ is constituted only of a two-way path along the bottom surface of the first semiconductor layer 14 and one side of the gate electrode 70. Since the above path does not involve another side, the drift length $D_L$ can be shortened in comparison with the three-way path of prior art described earlier with reference to FIG. 12. As a result, in addition to enabling a lower on-resistance commensurate with the reduced drift length $D_L$, the structure also provides for a reduction in the cell pitch because of the comparatively smaller projected area required for drain drift region 14a.

Moreover, since the channel region is positioned vertically against the silicon substrate 10, the trench gate structure makes a further reduction possible in the cell pitch compared with a planer gate structure.

As described above, the semiconductor device 500 in accordance with the present embodiment ensures a sufficient breakdown voltage for the device as supported by the insulation layers 30, which in return allows the size of the drain drift region 14a as the determining factor of the breakdown voltage to be set to a minimum. These features, consequently, help materialize a low on-resistance, high breakdown voltage, lateral power MOSFET, and microminiaturization of the device.

Note that this invention is not limited to the above-mentioned embodiments; it can be embodied in various different forms within the scope of the invention as laid out in the accompanying claims.

What is claimed is:

1. A semiconductor device containing a lateral MOS transistor, comprising:

a semiconductor substrate;

a drain drift region of a first conductive type formed on said semiconductor substrate;

an insulation layer disposed in a trench which is formed in said drain drift region by filling a trench with insulation material to extend to a depth equal to or greater than said body region and such that said drain drift region extends under said insulation layer;

a drain region formed along one side of said insulation layer, said drain region having a different doping concentration than said drain draft region;

a body region of a second conductive type located on the other side of said insulation layer and formed in said drain drift region, said body region including a portion in which a channel region is formed;

a source region of the first conductive type formed on the surface of said body region; and a trench gate having a gate insulation layer formed along the surface of a trench boring through said source region, said body region and said drain drift region, and a gate electrode formed in the trench and arranged through the gate insulation layer;

wherein said drain region extends greater than said insulation layer in depth to contact said drain drift region below the insulation layer;

wherein said source region is formed between said gate electrode and said drain region.

2. A semiconductor device containing a lateral MOS transistor, comprising:

a semiconductor substrate;

a first semiconductor layer of a first conductive type formed on said semiconductor substrate to constitute a drain drift region;

a second semiconductor layer of a second conductive type formed in said first semiconductor layer to constitute a body region, said body region including a portion in which a channel region is formed;

a third semiconductor layer of the first conductive type formed in said second semiconductor layer to constitute a source region;

a fourth semiconductor layer of the first conductive type formed in said first semiconductor layer to constitute a drain region, said fourth semiconductor layer having a different doping concentration than said first semiconductor layer; and an insulation layer disposed in a trench which is formed in said first semiconductor layer by filling said trench with insulating material along two sides of said fourth semiconductor layer to extend to a depth equal to or greater than said body region and such that said first semiconductor layer extends under said insulation layer;

wherein said fourth semiconductor layer extends greater than said insulation layer in depth to contact said first semiconductor layer below the insulation layer;

wherein said source region is formed between a gate and said drain region.

3. The semiconductor device according to claim 1, wherein said drain region has first and second drain regions; said first drain region being formed in contact with a drain electrode and doped with an impurity of a high concentration, and said second drain region being formed in contact with the drain drift region and doped with an impurity of a lower concentration than that of the first drain region.

4. The semiconductor device according to claim 1, further comprising a trench gate having a gate insulation layer formed along the surface of a trench boring through said source region, said body region and said drain drift region, and a gate electrode formed in the trench and arranged through the gate insulation layer.

5. The semiconductor device according to claim 4, wherein said trench gate reaches the surface or the inside of said semiconductor substrate.

6. The semiconductor device according to claim 1, further comprising an insulating substrate formed on said semiconductor substrate.

7. The semiconductor device according to claim 6, wherein the bottom of said drain region reaches said insulating substrate.

8. The semiconductor device according to claim 6, further comprising a trench gate which reaches said insulating substrate.

9. The semiconductor device according to claim 6, further comprising a trench gate which does not reach said insulating substrate.

10. The semiconductor device according to claim 1, wherein the drain electrode contacting said drain region has a portion penetrating into said drain region.

* * * * *

UNITED STATES PATENT AND TRADEMARK OFFICE
CERTIFICATE OF CORRECTION

PATENT NO. : 6,177,704

DATED : Jan 23, 2001

INVENTOR(S): Takashi SUZUKI, et al.

It is certified that an error appears in the above-identified patent and that said Letters Patent is hereby corrected as shown below:

On the title page, item (54), and at the top of column 1, the title should be:

--(54) SEMICONDUCTOR DEVICE WITH A HIGH BREAKDOWN VOLTAGE, LOW ON-RESISTANCE, LATERAL POWER MOSFET--

Signed and Sealed this

Fifteenth Day of May, 2001

*Attest:*

NICHOLAS P. GODICI

*Attesting Officer*     *Acting Director of the United States Patent and Trademark Office*